United States Patent [19]
Taniguchi et al.

[11] Patent Number: 5,692,280
[45] Date of Patent: Dec. 2, 1997

[54] MANUFACTURING METHOD OF LAMINATED CERAMIC ELECTRONIC COMPONENTS

[75] Inventors: Masaaki Taniguchi, Fukui-ken; Kyoshin Asakura, Sabae, both of Japan

[73] Assignee: Murata Manufacturing Co., Ltd., Japan

[21] Appl. No.: 457,407

[22] Filed: Jun. 1, 1995

[30] Foreign Application Priority Data

Jun. 2, 1994 [JP] Japan .................................. 6-145543

[51] Int. Cl.$^6$ .................................................. H01G 7/00
[52] U.S. Cl. ...................... 29/25.42; 29/414; 361/321.2
[58] Field of Search ................................ 29/25.42, 25.35, 29/411, 412, 414, 564.3, 592.1; 361/321.2, 321.3, 306.3; 264/61; 83/555, 929.2, 945

[56] References Cited

U.S. PATENT DOCUMENTS

| | | | |
|---|---|---|---|
| 4,355,457 | 10/1982 | Barlett et al. | 29/414 X |
| 4,564,980 | 1/1986 | Diepers | 29/25.35 |
| 4,852,227 | 8/1989 | Burks | 29/25.42 |
| 5,034,851 | 7/1991 | Monsorno et al. | 361/321.2 |
| 5,440,794 | 8/1995 | Kaeriyama et al. | 29/25.42 |

FOREIGN PATENT DOCUMENTS

| | | | |
|---|---|---|---|
| 0027455 | 7/1980 | Japan | 29/25.42 |

*Primary Examiner*—Peter Vo
*Assistant Examiner*—Khan Nguyen
*Attorney, Agent, or Firm*—Ostrolenk, Faber, Gerb & Soffen, LLP

[57] ABSTRACT

A method of manufacturing laminated ceramic electronic components includes a step of forming a block by laminating ceramic green-sheets each having a main surface on which interior electrodes are formed with intervals in a direction orthogonally intersecting the main surfaces of the green-sheets. In a first cutting step, a first dicing blade having a width of 0.3 mm is pressed against the block at positions corresponding to the intervals between the electrodes to form grooves extending from one main surface toward the other main surface of the block, thereby to form a green mother board series in which a plurality of green mother boards being divided by the grooves are connected to each other via connection portions. Each of the green mother boards includes a plurality of element portions. Thereafter, the green mother board series is fired in a firing step. In a second cutting step, a second dicing blade having a width of 0.4 mm is pressed into the grooves of the mother board series after firing, to cut the connection portions. In this second cutting step, a side surface of each said mother board is ground by a side surface of the second dicing blade to expose outer edges of the interior electrodes. An exterior electrode is then applied to the outer edges.

9 Claims, 5 Drawing Sheets

F I G. 1(A)
F I G. 1(B)
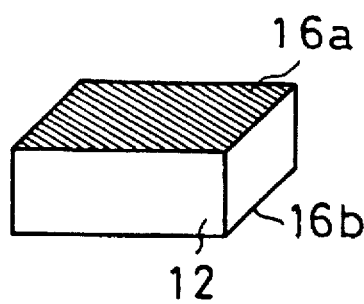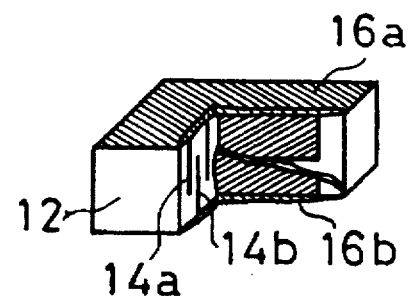
F I G. 2
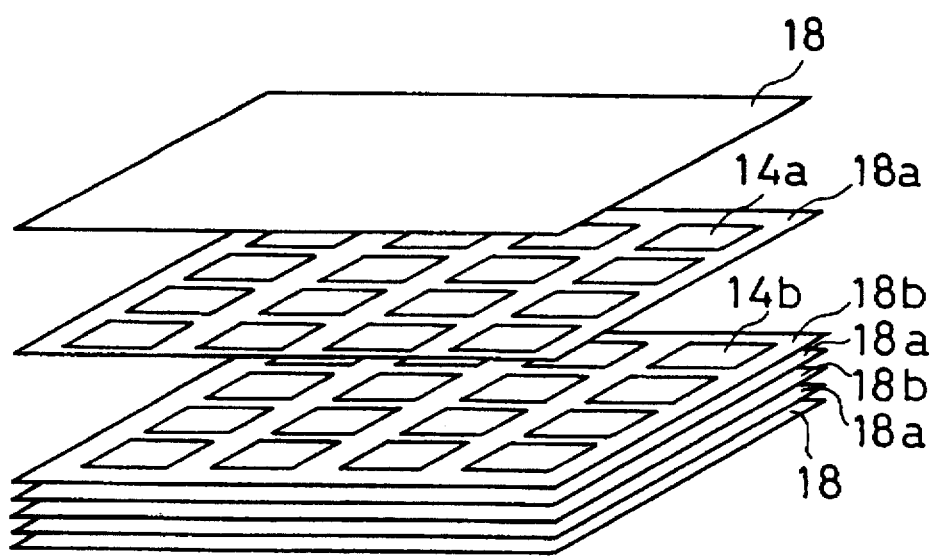

MANUFACTURING METHOD OF LAMINATED CERAMIC ELECTRONIC COMPONENTS

BACKGROUND OF THE INVENTION

1. Field of the Invention

The present invention relates to a manufacturing method of laminated ceramic electronic components. More specifically, the present invention relates to a manufacturing method of laminated ceramic electronic components such as laminated ceramic capacitors, LC composite ceramic components, ceramic filters, laminated piezoelectric actuators, each of which includes interior electrodes, and exterior electrodes connected to the interior electrodes.

2. Description of the Prior Art

In U.S. Pat. application Ser. No. 08/126,486 (U.S. Pat. No. 5,440,794) filed on Sep. 24, 1993 and assigned to the same assignee of the present invention discloses a manufacturing method of laminated ceramic electronic components, in which a block is formed by laminating a plurality of ceramic green-sheets each having one main surface on which a number of interior electrodes are formed so as to form a block, and the block is fired, and thereafter, a mother board is obtained by slicing the block, and then, a chip is cut-out from the mother board.

In the prior art, since the size of the block is large, there is a problem that the characteristics of laminated ceramic electronic components as cut-out scatter because when the block is fired, the debindering (a process for removing the binder included in the ceramic green-sheets) is not sufficient and/or unevenness of a fired state of the block occurs.

In order to avoid such a problem, a method is considered in which a plurality of green mother boards are formed by slicing the block before the firing, then firing, the green mother boards and the chip is cut-out from the mother board as fired. However, in such a method, due to a difference between a contraction amount of the interior electrode and a contraction amount of the ceramic green-sheet at a time of the firing, there occurs another problem that the interior electrode is not exposed at a side surface of the chip completely, and therefore, poor contact is made between the external electrode formed on the side surface of the mother board, i.e. the side surface of the chip, and the interior electrodes.

SUMMARY OF THE INVENTION

Therefore, a principal object of the present invention is to provide a novel manufacturing method of laminated ceramic electronic components.

Another object of the present invention is to provide a manufacturing method of laminated ceramic electronic components, in which no scattering occurs in the characteristics of the laminated ceramic electronic components and no poor contact occurs between the interior electrode and the external electrode.

A manufacturing method according to the present invention comprises steps of: (a) forming a block by laminating a plurality of ceramic green-sheets each having one main surface on which a plurality of interior electrodes are formed with intervals therebetween in a direction orthogonally intersecting the main surfaces of the green-sheets; (b) forming a green mother board series in which a plurality of green mother boards being divided by grooves are connected to each other via a connection portion, by forming grooves extending from the one main surface toward the opposite of the block at a position corresponding to the interval between the interior electrodes; (c) firing the green mother board series; (d) by removing the connection portion of the mother board series, separating respective mother boards from each other, and exposing the interior electrodes at a side surface of each of the mother boards.

The step (b) is performed before the block being formed by the step (a) at the step (c). In the step (b), a first dicing blade is utilized, for example. More specifically, the first dicing blade is pressed against one main surface of the block at the position corresponding to the interval between the interior electrodes so as to form the groove extending from the one main surface toward the other main surface of the block, whereby the green mother board series is formed. The groove becomes a groove having a predetermined width in a mother board series as fired. Then, in the step (d), a second dicing blade having a thickness larger than the predetermined width of the groove in the mother board series is utilized. More specifically, a side surface of each of the plurality of mother boards is ground by a side surface of the second dicing blade such that the interior electrodes are exposed at the side surface of the mother board, and by cutting the connection portion by the second dicing blade, respective mother boards are separated from each other.

According to the present invention, the groove is formed in the block by performing a preliminary cutting process between the step (a) and the step (c). Therefore, a surface area of the block, i.e. the green mother board series becomes large. Accordingly, the organic gas generated at a time of the debindering can be sufficiently discharged, and the exchange between the binder and the atmosphere gas can be performed efficiently. Therefore, it is possible to solve the problem of the aforementioned prior art that the characteristics of the laminated ceramic electronic components scatter because of the insufficiency of the debindering and/or the evenness of the firing state of the block.

On the other hand, in the step (c), i.e. firing step, the outer edge of the interior electrode is recessed from the side surface of the mother board due to the difference between a contraction amount of the interior electrode contained in the green mother board and a contraction amount of the ceramic green-sheet. However, by utilizing a dicing blade having a thickness larger than the predetermined width of the groove in the mother board series, the side surface of the mother board is ground, and therefore, the outer edge of the interior electrode can be completely exposed at the side surface of the mother board. Accordingly, in applying the exterior electrode on the side surface of the mother board being cut-out by cutting the connection portion by means of the dicing blade, it is possible to surely connect the exterior electrode and the interior electrode to each other. Therefore, no poor contact occurs between the exterior electrode and the interior electrode.

In addition, each mother board is succeedingly processed in a step (e). That is, in the step (e), the exterior electrode is applied on the side surface of the mother board. Succeedingly, in a step (f), respective element portions (chips) are cut-out from the mother board.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is an illustrative view showing one example of a laminated ceramic capacitor capable of being manufactured by one embodiment according to the present invention; and FIG. 2 to FIG. 10 are illustrative views showing respective steps of the embodiment, wherein FIG. 2 is an illustrative view showing a step for forming a block, FIG. 3 is an illustrative view showing the block, FIG. 4 is an illustrative view showing a step for forming a green mother board series by forming grooves in the block shown in FIG. 3, FIG. 5 is an illustrative view showing another example of the groove formed in the block, FIG. 6 is an illustrative view showing a step for cutting a mother board series as fired, FIG. 8 is an illustrative view showing a mother board as separated, FIG. 9 is an illustrative view showing a state where an exterior electrode is applied on a side surface of the mother board, and FIG. 10 is an illustrative view showing a state where the laminated ceramic capacitor shown in FIG. 1 is cut-out.

DETAILED DESCRIPTION OF THE PREFERRED EMBODIMENTS

Figure 3:
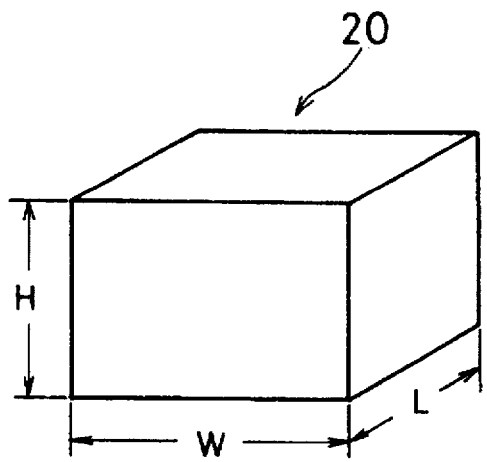

A laminated ceramic capacitor 10 capable of being manufactured by one embodiment according to the present invention includes a rectangular parallelepiped chip 12 as shown in FIG. 1, and interior electrodes 14a and 14b are alternately laminated within an inside of the chip 12 such that one ends of the interior electrode 14a are exposed on an upper surface (a first side surface) of the chip 12 and one ends of the interior electrode 14b are exposed on a lower surface (a second side surface) of the chip 12. Then, exterior electrodes 16a and 16b are applied onto the upper surface and the lower surface of the chip, respectively. The exterior electrodes 16a and 16b are connected to the interior electrodes 14a and 14b, respectively. A manufacturing method of such a laminated ceramic capacitor 10 is as follows:

At first, as shown in FIG. 2, ceramic green-sheets 18a each having one main surface on which a number of individual interior electrodes 14a are printed, and ceramic green-sheets 18b each having one main surface on which a number of individual interior electrodes 14b are printed are alternately laminated in a direction orthogonally intersecting the main surfaces. Ceramic green-sheets 18 with no electrodes are further laminated on an uppermost layer and a lowermost layer. That is, the interior electrodes 14a and the interior electrodes 14b are printed on the respective ceramic green-sheets 18a and 18b in a manner that positions of the interior electrodes 14a and positions of the interior electrodes 14b are slightly deviated from each other. Therefore, when the ceramic green-sheets 18a on which the interior electrodes 14a are formed and the ceramic green-sheets 18b on which the interior electrodes 14b are formed are alternately laminated, a block 20 (FIG. 3) in which the interior electrodes are deviated in position for each layer can be formed. The block 20 has a size of W(width) =50 mm, H(height) =4 mm and L(length) =50 mm.

Figure 4:
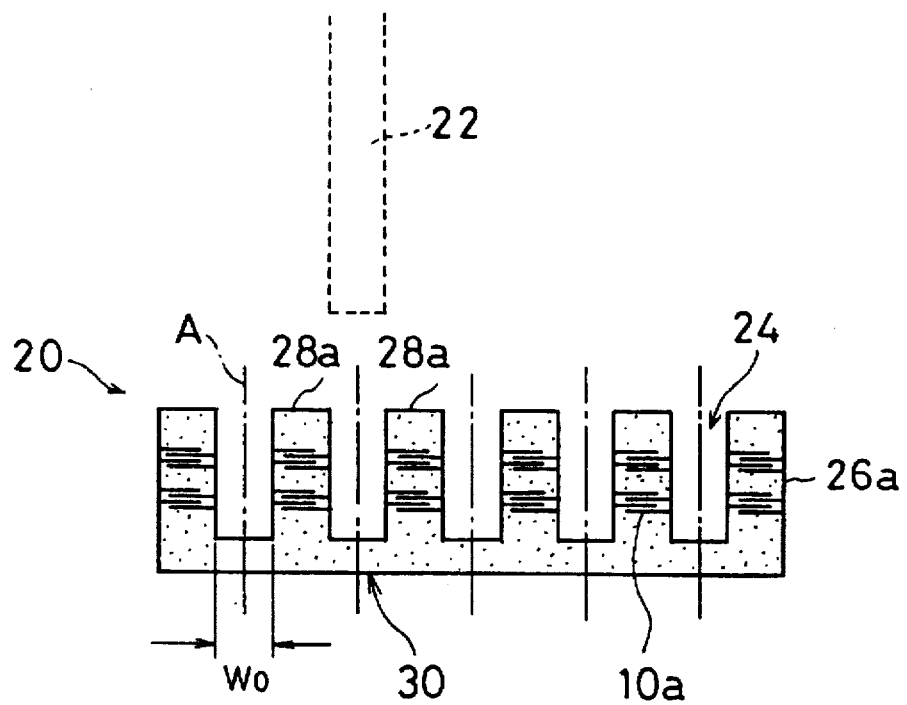

Next, a preliminary cutting step or a first cutting step shown in FIG. 4 is performed. More specifically, grooves 24 are formed with utilizing a dicing blade 22 having a thickness of 0.3 mm, for example, at predetermined positions of the block 20, which are corresponding to positions at the intervals between the adjacent internal electrodes 14a or 14b and a position at which respective mother boards are separated from each other later. As well known, the dicing blade 22 is obtained by hardening the grinding particles such as diamond by the binding agent. Each of the grooves 24 has a width ($W_0$) of 0.31 mm, for example, and extended from one main surface to other main surface of the block 20. That is, the grooves 24 are formed in a direction orthogonally intersecting the main surfaces of the ceramic green-sheets 18a, 18b and 18 at predetermined positions of the block 20. By forming the grooves 24 shown in FIG. 4, a green mother board series 26a is formed. In the green mother board series 26a, respective green mother boards 28a are divided by the grooves but connected to each other by connection portions 30. As shown in FIG. 4, each of the green mother boards 28a includes a plurality of element portions 10a to be separated in a direction orthogonally intersecting the main surface of the ceramic green-sheets 18a, 18b and 18.

Figure 5:
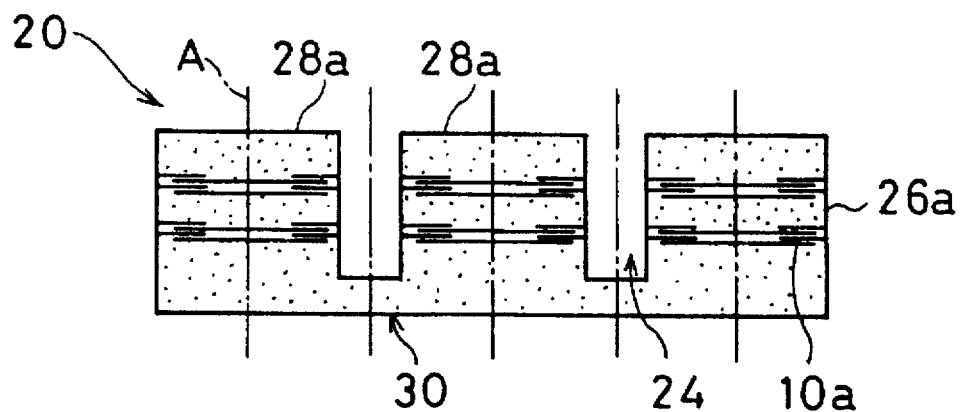

In addition, in FIG. 4 embodiment, the grooves 24 are formed at all the cutting positions (shown by one-dotted lines A in FIG. 4); however, as shown in FIG. 5, the grooves may be formed at cutting positions A at every predetermined numbers of two or more.

Figure 6:
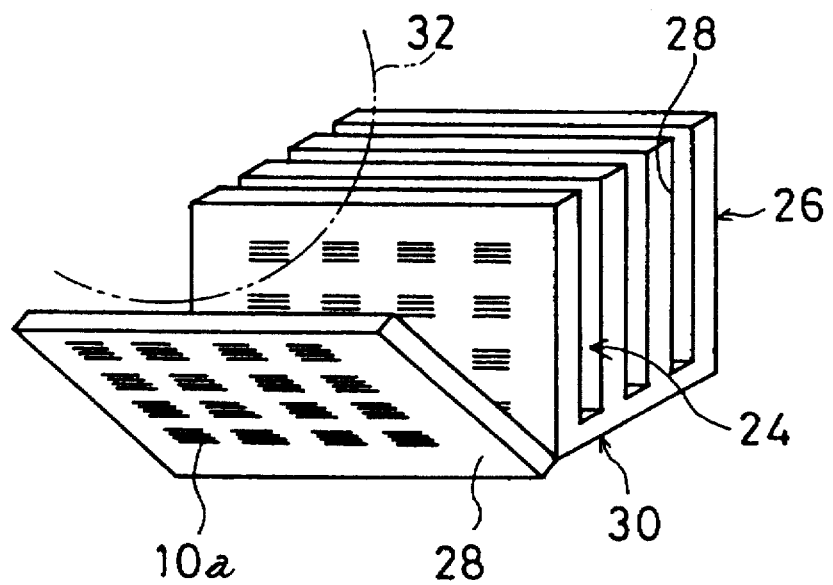

Next, a firing step is performed. That is, the green mother board series 26a shown in FIG. 4 is fired under a condition of 1300° C. and two hours, whereby a mother board series 26 shown in FIG. 6 is obtainable. In a state where the green mother board series 26a is fired, that is, in the mother board series 26, the width ($W_1$, FIG. 7(B)) of the groove 24 becomes 0.25 mm.

Figure 7A:
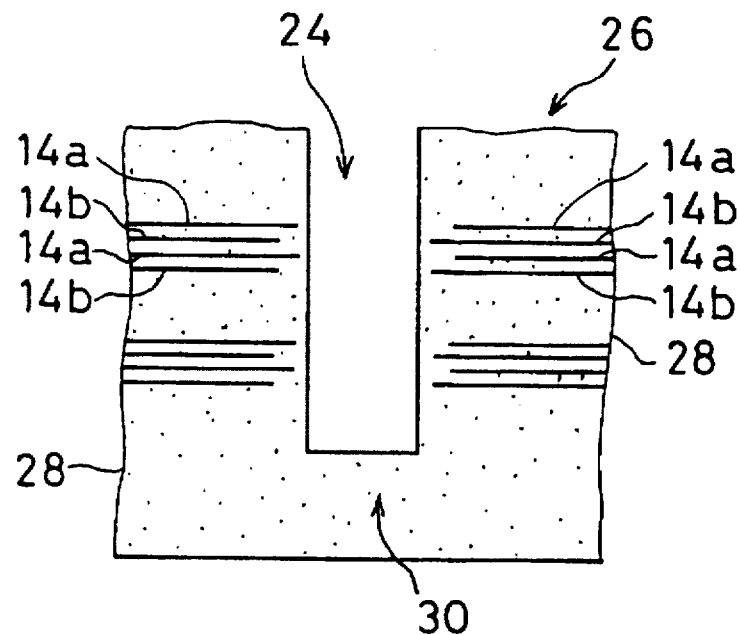
FIG. 7(A) is an illustrative view showing a portion of the groove in the mother board series.
Figure 7B:
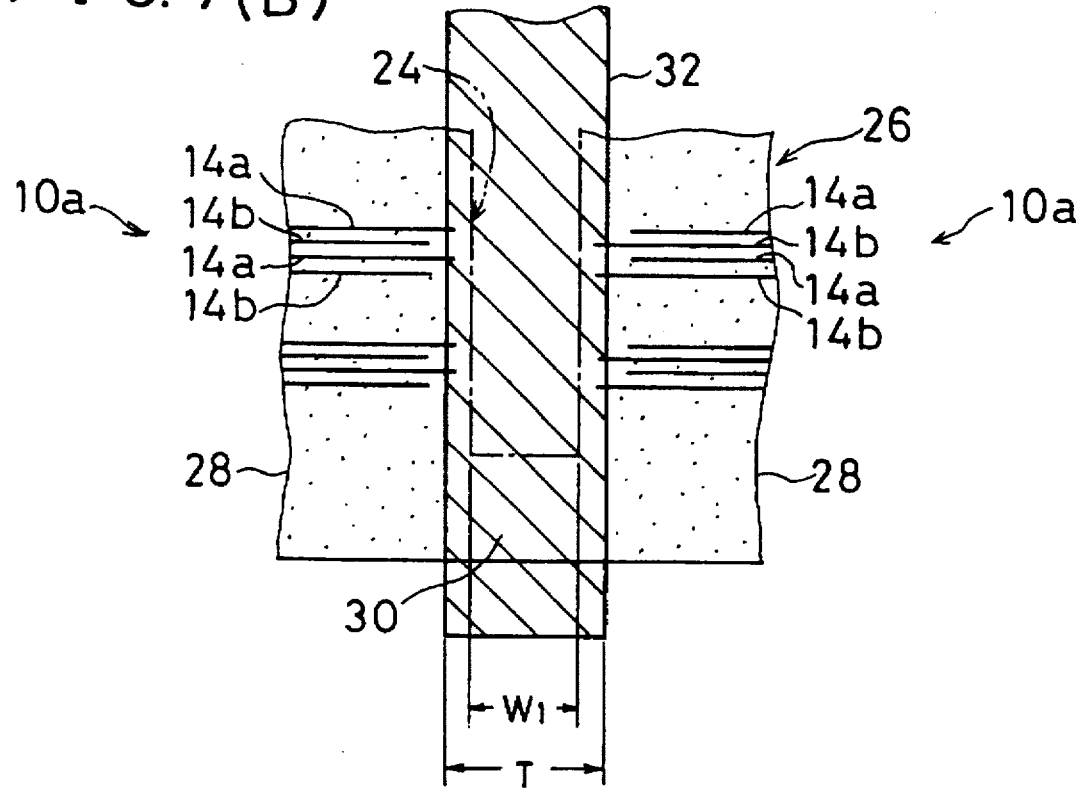
FIG. 7(B) is an illustrative view showing a state where the portion of the groove is cut.
Figure 8:
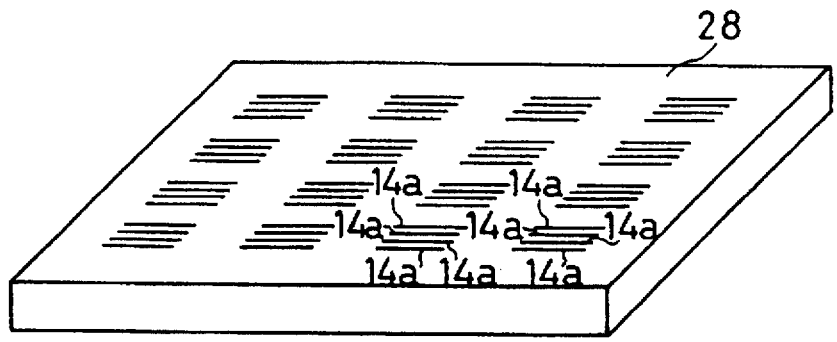
Figure 9:
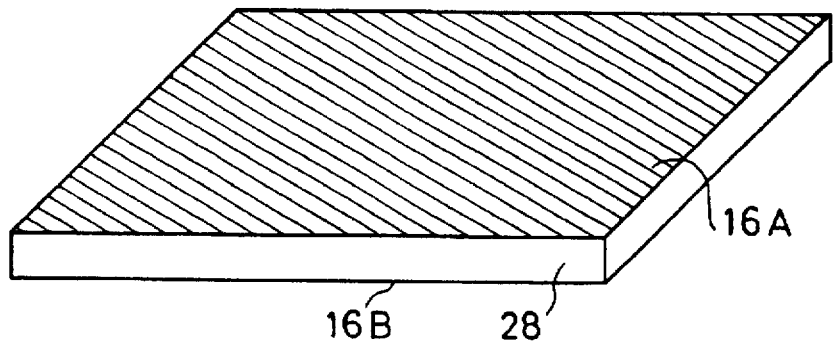

Then, with utilizing a dicing blade 32 having a thickness (T) of 0.4 mm, for example, larger than the width of 0.25 mm of the groove 24 as shown in FIG. 7(B), a second cutting step is performed. More specifically, as shown in FIG. 7(B), the dicing blade 32 is pressed into the groove 26 from an open end of the groove 24. The dicing blade 32 is also obtained by hardening the grinding particles such as diamond by the binding agent. Therefore, by pressing the dicing blade 32 into the groove 24, inner surfaces defining the groove 24, i.e. side surfaces of the mother board 28 is ground by side surfaces of the dicing blade 32 through such the grinding, outer edges of the interior electrodes 14a and 14b of each element portion 10a are completely exposed at the side surfaces of the mother board 28. Then, a blade edge of the dicing blade 32 is brought into contact with the connection portion 30, and therefore, the connection portion 30 is removed by the blade edge. Therefore, as shown in FIG. 6 and FIG. 8, respective mother boards 28 are separated or divided from each other.

Figure 10:
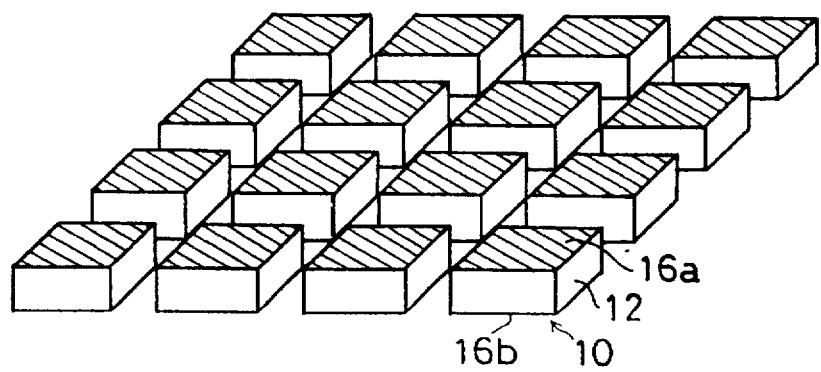

Succeedingly, as shown in FIG. 10, exterior electrodes 16a and 16b are formed on the side surfaces, i.e. the upper surface and the lower surface of the mother board 28 with painting the electric conductive paste on the upper surface and the lower surface, for example. In addition, in order to form such the exterior electrodes 16a and 16b, the painting of the electric conductive paint, the dry plating, the electroless plating and etc. may be utilized.

Thereafter, by dicing the mother board 28 with utilizing a dicing blade (not shown), the element portions 10a are cut-out from the mother board 28. That is, by cutting the mother board 28 in a direction orthogonally intersecting the main surface or the side surface of the mother board 28 as shown in FIG. 10, respective element portions 10a i.e. respective laminated ceramic capacitors 10 (FIG. 1) are obtained.

In the above described embodiment, prior to the firing, the grooves are formed on the block 20 through the preliminary cutting process. Therefore, the surface area of the block 20, i.e. the green mother board series 26a becomes large. Therefore, the organic gas generated at a time of the debindering can be discharged sufficiently, and the exchange between the binder and the atmosphere gas can be performed efficiently. Therefore, it is possible to solve the problem of the prior art that the debindering is not sufficient and the unevenness of the firing state of the block occurs.

On the other hand, in the firing step, due to the difference between a contraction amount of the interior electrodes 14a and 14b contained in the green mother board 28a and a contraction amount of the ceramic green-sheets 18a, 18b and 18 (FIG. 2), the edges of the interior electrodes 14a and 14b are recessed from the side surfaces of the mother board 28 as shown in FIG. 7(A); however, with utilizing the dicing blade 32 having a thickness larger than the width of the groove 24 of the mother board series 28 in the second cutting step shown in FIG. 6 and FIG. 7(B), the side surfaces of the mother board 28 are ground, and therefore, it is possible to the outer edges of the interior electrodes 14a and 14b to be exposed at the side surfaces of the mother board 28. Therefore, in forming the exterior electrodes on the side surfaces of the mother boards being separated from each other by cutting the connection portion 30 by the dicing blade, it is possible to surely connect the exterior electrodes and the interior electrodes to each other. Therefore, no poor contact occurs between the exterior electrodes 16a and 16b and the interior electrodes 14a and 14b.

In the above described embodiment, the thickness of the dicing blade 22 utilized in FIG. 4 is smaller than the thickness of the dicing blade 32 utilized in FIG. 7(B). The reason why is that by utilizing the dicing blade 32 having the thickness larger than the width of the groove 24 of the mother board 28 as fired, the grinding of the side surfaces of the mother board 28 and the removing of the connection portions 30 can be substantially simultaneously, i.e. through a single step. Therefore, according to the contraction rate of the groove from a state of the green mother board series 28a to a state of the mother board series 28, that is, according to the width of the groove in the mother board 28 obtained by firing the green mother board series 281a, the thickness of the dicing blade 32 may be smaller or equal to the thickness of the dicing blade 22. That is, the thickness of the dicing blade 32 is determined according to the width of the groove 24 of the mother board series 28 ($W_1 < T$).

More specifically, the thickness of the dicing blade 32 is set as a thickness larger than the width of the mother board series 28 by 0.05 mm –0.3 mm. If the difference between the thickness of the dicing blade 32 and the width of the groove 24 is smaller than 0.05 mm, there is an occasion that the interior electrodes 14a and 14b can not be completely exposed. If the difference between the thickness of the dicing blade 32 and the width of the groove 24 is larger than 0.3 mm, the ground amount of the side surfaces of the mother board series 28 becomes too large, and therefore, the waste of the material is increased, and the cost becomes high. In the present invention, the difference between the thickness of the dicing blade 32 and the width of the groove 24 is set within a range of 0.05 mm –0.33 mm, more preferably, within a range of 0.1 mm 0.2 mm.

Furthermore, in FIG. 4, the width of the groove 24 is set within a range of 0.1 mm –0.5 mm. If the width of the groove is less than 0.1 mm, since the width of the groove is too narrow, the discharge of the gas at a time of the debindering becomes insufficient, and the unevenness of the firing occurs. Furthermore, even if the width of the groove 24 is made larger than 0.5 mm, the remarkable improvement can not be obtained in the gas discharge and the firing unevenness, and since the green mother board series 18a becomes large, the waste of the material is increased, and therefore, the cost becomes high. Therefore, in the present invention, the width of the groove 24 being formed in the block 22 is set within a range of 0.1 mm –0.5 mm, more preferably, within the range of 0.3 mm –0.4 mm.

In addition, it is needless to say that the present invention is applicable to arbitrary laminated ceramic electronic components having the interior electrode and the exterior electrode connected thereto, such as the LC composite ceramic components, the laminated piezoelectric actuator and etc. other than the laminated ceramic capacitor of the above described embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a plurality of mother boards for forming laminated ceramic electronic components therefrom, comprising the steps of:

(a) forming a block by laminating a plurality of ceramic green-sheets each having a main surface on which a plurality of interior electrodes are formed with intervals therebetween, wherein said ceramic green-sheets are laminated, in a direction orthogonally intersecting the main surface;

(b) forming grooves having a predetermined width and extending from a first surface toward an opposite second surface of said block at positions corresponding to the intervals between said interior electrodes in said block so as to form a green mother board series in which a plurality of mother boards being divided by said grooves are connected to each other via a connection portion;

(c) firing said green mother board series; and (d) separating said mother board series at said grooves to obtain a plurality of mother boards after firing said green mother board series in said step (c), by removing said connection portion, and exposing said interior electrodes at a side surface of each of said plurality of mother boards, utilizing a dicing blade, having a thickness larger than said predetermined width; wherein said dicing blade is operated in said grooves to grind the side surface of each of said plurality of mother boards with a side surface of said dicing blade so as to expose said interior electrodes, and to cut said connection portion.

2. A manufacturing method according to claim 1, further comprising the steps of (e) forming an exterior electrode to be connected to said interior electrodes on said side surface of said mother board; and (f) cutting-out respective element portions from said mother board.

3. A manufacturing method according to claim 1, wherein said width of said grooves formed in said step (b) is 0.1 mm –0.5 mm.

4. A manufacturing method according to claim 3, wherein a difference between said width of said grooves and a thickness of said dicing blade is 0.05 mm –0.3 mm.

5. A manufacturing method according to claim 3, wherein said width is 0.3 mm –0.4 mm.

6. A manufacturing method according to claim 4, wherein said difference is 0.1 mm –0.2 mm.

7. A manufacturing method according to claim 6, wherein said width is 0.3 mm –0.4 mm.

8. A manufacturing method according to claim 1, wherein a difference between said width of said grooves and a thickness of said dicing blade is 0.05 mm –0.3 mm.

9. A manufacturing method according to claim 8, wherein said difference is 0.1 mm –0.2 mm.

* * * * *